United States Patent
Dalmia et al.

(10) Patent No.: US 11,226,734 B1
(45) Date of Patent: Jan. 18, 2022

(54) TRIGGERING MULTIPLE ACTIONS FROM A SINGLE GESTURE

(71) Applicant: Dassault Systemes SolidWorks Corporation, Waltham, MA (US)

(72) Inventors: Priya Dalmia, Lexington, MA (US); Chinloo Lama, Bolton, MA (US)

(73) Assignee: DASSAULT SYSTEMES SOLIDWORKS CORPORATION, Waltham, MA (US)

( * ) Notice: Subject to any disclaimer, the term of this patent is extended or adjusted under 35 U.S.C. 154(b) by 59 days.

(21) Appl. No.: 15/853,461

(22) Filed: Dec. 22, 2017

Related U.S. Application Data

(60) Provisional application No. 62/440,822, filed on Dec. 30, 2016.

(51) Int. Cl.
*G06F 3/048* (2013.01)
*G06F 3/0488* (2013.01)
*G06F 3/0484* (2013.01)
*G06F 3/0354* (2013.01)
*G06F 3/0481* (2013.01)

(52) U.S. Cl.
CPC ...... *G06F 3/04883* (2013.01); *G06F 3/03545* (2013.01); *G06F 3/04817* (2013.01); *G06F 3/04845* (2013.01); *G06F 3/04847* (2013.01); *G06F 3/04815* (2013.01); *G06F 2203/0381* (2013.01)

(58) Field of Classification Search
CPC .... G06F 3/0346; G06F 3/0485; G06F 3/0488; G06F 3/03547; G06F 3/016; G06F 3/0482; H04N 3/155
See application file for complete search history.

(56) References Cited

U.S. PATENT DOCUMENTS

| | | | |
|---|---|---|---|
| 6,567,102 B2 | 5/2003 | Kung | |
| 8,136,052 B2* | 3/2012 | Shin | G06F 3/04886 715/835 |
| 9,026,939 B2 | 5/2015 | Smus | |
| 9,465,457 B2 | 10/2016 | Thompson et al. | |
| 9,715,864 B2 | 7/2017 | Mazzola | |
| 11,068,155 B1 | 7/2021 | Dalmia et al. | |
| 2002/0011990 A1* | 1/2002 | Anwar | G06F 3/04847 345/173 |
| 2006/0244735 A1* | 11/2006 | Wilson | G06F 3/0488 345/173 |

(Continued)

OTHER PUBLICATIONS

Mings, J., "Onshape Snags Patent For Their Precision Touch Selection Shenanigans" https://www.solidsmack.com/cad/onshape-new-proximity-precision-touch-patent/ [Retrieved on Dec. 20, 2017].

(Continued)

*Primary Examiner* — Rashawn N Tillery
(74) *Attorney, Agent, or Firm* — Hamilton, Brook, Smith & Reynolds, P.C.

(57) ABSTRACT

A computer-implemented method and system enables the execution of multiple commands from a single gesture by detecting an object is touching a touchscreen device, timing the duration that the object remains on the surface of the touchscreen device, indicating the length of the duration, and executing one of two or more commands based on the length of the duration.

19 Claims, 8 Drawing Sheets

(6 of 8 Drawing Sheet(s) Filed in Color)

(56) References Cited

U.S. PATENT DOCUMENTS

| | | | |
|---|---|---|---|
| 2008/0204476 A1 | 8/2008 | Montague | |
| 2009/0083666 A1* | 3/2009 | Fitzmaurice | G06F 3/04815 715/834 |
| 2010/0009746 A1* | 1/2010 | Raymond | A63F 13/10 463/31 |
| 2011/0093812 A1* | 4/2011 | Fong | G06F 3/0485 715/810 |
| 2012/0326994 A1* | 12/2012 | Miyazawa | G06F 3/0346 345/173 |
| 2013/0019174 A1 | 1/2013 | Gil et al. | |
| 2013/0145287 A1* | 6/2013 | Jung | G06F 3/0486 715/753 |
| 2013/0174033 A1* | 7/2013 | Hanukaev | G06F 3/0488 715/273 |
| 2013/0176245 A1 | 7/2013 | Kwon | |
| 2013/0246970 A1* | 9/2013 | Helle | G06F 3/0482 715/822 |
| 2013/0268883 A1* | 10/2013 | Kim | G06F 3/0485 715/784 |
| 2013/0293496 A1* | 11/2013 | Takamoto | G06F 3/0482 345/173 |
| 2013/0332892 A1* | 12/2013 | Matsuki | G06F 3/0488 715/863 |
| 2014/0078102 A1* | 3/2014 | Araki | G06F 3/016 345/174 |
| 2014/0125657 A1 | 5/2014 | Murali | |
| 2014/0152594 A1 | 6/2014 | Kim | |
| 2014/0313130 A1 | 10/2014 | Yamano et al. | |
| 2014/0372923 A1* | 12/2014 | Rossi | G06F 3/0486 715/769 |
| 2016/0274686 A1* | 9/2016 | Alonso Ruiz | G06F 3/03547 |
| 2016/0357281 A1* | 12/2016 | Fleizach | G06F 3/04883 |
| 2017/0083229 A1 | 3/2017 | Luo et al. | |
| 2017/0220241 A1 | 8/2017 | Vangapalli et al. | |
| 2017/0255263 A1 | 9/2017 | Letendre | |
| 2017/0336966 A1 | 11/2017 | Morton et al. | |

OTHER PUBLICATIONS

Final Office Action, U.S. Appl. No. 15/853,412, entitled, "A User Interface Tool for a Touchscreen Device", dated Aug. 23, 2019.

Non-Final Office Action, U.S. Appl. No. 15/853,412, entitled, "User Interface Tool for a Touchscreen Device," dated May 1, 2019.

NonFinal Office Action, U.S. Appl. No. 15/853,412, "User Interface Tool for a Touchscreen Device," dated Dec. 11, 2019.

Final Office Action, U.S. Appl. No. 15/853,412, entitled: "User Interface Tool for a Touchscreen Device," dated Apr. 16, 2020.

NonFinal Office Action, U.S. Appl. No. 15/853,412, "A User Interface Tool for a Touchscreen Device," dated Aug. 19, 2020.

Final Office Action for U.S. Appl. No. 15/853,412 dated Feb. 11, 2021, titled "A User Interface Tool for a Touchscreen Device".

Notice of Allowance for U.S. Appl. No. 15/853,412 dated May 26, 2021 titled "A User Interface Tool for a Touchscreen Device".

Advisory Action for U.S. Appl. No. 15/853,412 dated Apr. 28, 2021 titled "A User Interface Tool for a Touchscreen Device".

* cited by examiner

102

104

106

402

TRIGGERING MULTIPLE ACTIONS FROM A SINGLE GESTURE

RELATED APPLICATION

This application claims the benefit of U.S. Provisional Application No. 62/440,822, filed on Dec. 30, 2016. The entire teachings of the above application are incorporated herein by reference.

BACKGROUND OF THE INVENTION

Computer-aided design (CAD) software allows a user to construct and manipulate complex three-dimensional (3D) models. A number of different modeling techniques can be used to create a 3D model. One such technique is a solid modeling technique, which provides for topological 3D models where the 3D model is a collection of interconnected topological entities (e.g., vertices, edges, and faces). The topological entities have corresponding supporting geometrical entities (e.g., points, trimmed curves, and trimmed surfaces). The trimmed surfaces correspond to topological faces bounded by edges. Hereinafter, the terms vertex, edge, and face will be used interchangeably with their respective, corresponding geometric entities.

A design engineer is a typical user of a 3D CAD system. The design engineer designs physical and aesthetic aspects of 3D models, and is skilled in 3D modeling techniques. The design engineer creates parts and may assemble the parts into a subassembly or an assembly. A subassembly may also consist of other subassemblies. An assembly is designed using parts and subassemblies. Parts and subassemblies are hereinafter collectively referred to as components.

Touch-enabled computer hardware devices are enhancing the tools used by the professional and commercial CAD industry. In order for a company to accommodate customers and support touchscreen hardware devices on which a user may choose to execute a software application or service, software applications (not only CAD applications) need to adapt and provide finger-friendly support for touch-enabled screens. Currently, a large number of client applications exist that are designed to work primarily with mouse and keyboard interactions. To ensure an uninterrupted experience with the same software being used on touchscreen and non-touchscreen devices, software commands and features need to be accessible via touch (e.g., fingertip and stylus) alone.

One-finger interaction is the primary touch interaction that a user has when working with a touchscreen. Therefore, assigning often-used interactions that a three-button mouse can support may cause multiple conflicts in practice. An example of the many commands that may be executed by pressing one finger on a mouse device are (a) left button event indicates that a selected object may be dragged, (b) middle button or dial event indicates that a selected object may be rotated, (c) right button event indicates that a menu should be displayed, and (d) a combination of a button and cursor motion may indicate an area should be magnified.

In addition to mapping mouse interactions to touch interactions, consideration must be given to the size of hit areas of an object. A fingertip is typically much larger than a cursor. Thus, designing user interface interactions for touch must also accommodate for the larger, less precise contact areas of touch technology.

Furthermore, some touch systems magnify an object by zooming in on the object then zooming back out after a selection is made (e.g., after a feature or component of a 3D model is selected). However, when magnifying an object, part of the object may be hidden by the user's finger, which is a further drawback of the current state of the art. This is particularly awkward when a user is attempting to drag a magnifier tool to a particular point, an action that needs accuracy. Additionally, prior art that shows the magnified area in a bubble above the touch point of the fingertip or stylus loses the visual context of the magnified area and the magnified area is not directly related to the area that is not magnified around the fingertip or stylus.

A system and method that enables touch-friendly interactions for enabling legacy applications to be interactive via touch devices while addressing the foregoing problems would be a beneficial improvement over current state-of-the-art CAD systems.

SUMMARY OF THE INVENTION

In general, in one aspect, embodiments of the present invention feature computer-implemented methods for executing multiple commands from a single gesture. The methods include detecting a presence of an object touching a touchscreen device, timing the duration that the object remains on the surface of the touchscreen device, checking a threshold value and determine from that threshold value whether to execute one command or another command. The object may be a finger or a stylus.

Further embodiments indicate a rate of progress, which is a measurement of the duration of the object touching the screen, by a visual and/or audible means. For the visual means, a progress graphic is displayed surrounding a location of the object on the touchscreen display. To begin the duration, the user may drag the object.

Embodiments execute a first command after determining that a position of the object on the touchscreen device is unchanged when the object is removed from the touchscreen device. Additionally, in an embodiment, one command is a user interface tool that is used to perform a highlight and a select operation.

In embodiments, the one or another command displays a magnifier tool and the visual representation of the magnifier tool is offset from a touch position.

Other embodiments include a computer system having a processor operatively coupled to a data storage system and a data storage memory operatively coupled to the processor. In such embodiments, the data storage memory comprises instructions to configure the processor to detect an object touching a touchscreen display, calculate an elapsed time between a first touch event and a second touch event, and use the elapsed time calculation to determine which of two operations to perform. If the elapsed time calculation is below a threshold a first operation is performed. If the elapsed time calculation is above a threshold a second operation is performed.

Other embodiments include a non-transitory computer-readable data storage medium comprising instructions that cause a computer to detect an object touching a touchscreen display, calculate an elapsed time between a first touch event and a second touch event, and use the elapsed time calculation to determine which of two operations to perform. If the elapsed time calculation is below a threshold a first operation is performed. If the elapsed time calculation is above a threshold a second operation is performed.

In other embodiments of a non-transitory computer-readable data storage medium and other embodiments of a computer system, the first event indicates that the object is being dragged on the touchscreen display and the second event indicates that the object is no longer dragging on the touchscreen. Additionally, the rate of progress is a measurement elapsing time after the first event rate of progress is indicated visually.

Additional computer-readable data storage medium and computer systems embodiments may include any one or more of the following: a changing graphical object around and outside a diameter surrounding the object touching the touchscreen display, where the changing graphical object indicates the rate of progress; executing the first operation after determining that a position of the object on the touchscreen display is unchanged when the object is removed from the touchscreen display; one of the operations displaying a user interface tool to perform a magnify operation where the user interface tool is initially offset from a position of the touch object touching the screen.

The details of one or more embodiments of the invention are set forth in the accompanying drawings and the description that follows. Other features, objects, and advantages of the invention will be apparent from the description and drawings, and from the claims.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The foregoing will be apparent from the following more particular description of example embodiments of the invention, as illustrated in the accompanying drawings in which like reference characters refer to the same objects throughout the different views. The drawings are not necessarily to scale, emphasis instead being placed upon illustrating embodiments of the present invention.

DETAILED DESCRIPTION OF THE INVENTION

The present invention applies to touch sensitive computer systems, and the use of a stylus or a user's fingertip to initiate a command to the computer system. The present invention allows a user to trigger multiple actions from a one-finger hold gesture and specific actions depending on the timing of one-finger touch interaction. The present invention enables users to contextually zoom into a three-dimensional (3D) model and make precise selection in a 3D window without obscuring contextual content while making the selection because the present invention allows the center of a magnified and/or selection area to be located relative to the geometry around the magnified and/or selection area.

Touchscreen computer systems may be automatically detected, in which case, an embodiment of the present invention adds a user interface (UI) button among the favorite buttons in a UI panel for touch interaction. Additionally, the present invention can automatically enable Touch Mode when tablet mode is enabled on a computer system.

The present invention overcomes drawbacks in state of the art systems by initiating one of multiple commands when a press of a finger or stylus is detected on the touchscreen display. Which of the multiple commands is initiated is determined by the duration that the finger or stylus is pressed on the display. Feedback is given to the user such that the user is aware of which of the multiple commands will be initiated. Hereinafter, embodiments described herein that refer to touch interactions with a finger will also encompass touch interactions with a stylus.

Figure 1A:
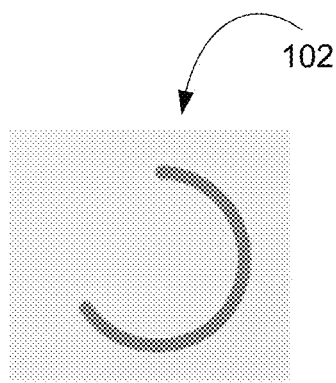
FIGS. 1a, 1b, and 1c are illustrations of progress rings in an embodiment of the present invention.
Figure 1B:
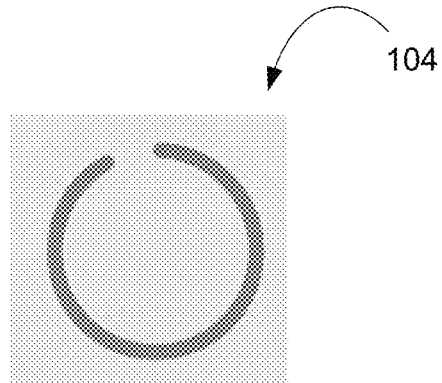
Figure 1C:
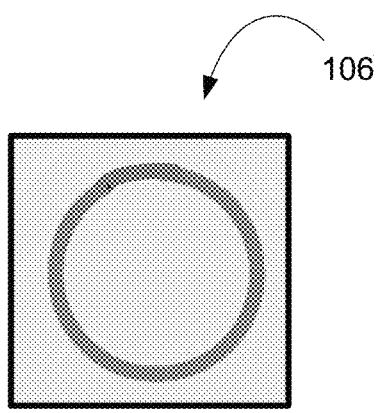

In an embodiment of the present invention, when a finger (or stylus) is placed on the touchscreen, a progress ring begins to grow around the finger (or stylus). Illustrated in FIGS. 1a and 1b are examples of progress rings. In FIG. 1a, a progress ring 102 that is approximately two-thirds of a circle is shown. In FIG. 1b, a nearly full circle progress ring 104 is shown. FIG. 1c illustrates a full progress ring 106. The growth of the progress ring 102/104 from approximately two-thirds of a circle to a nearly full circle visually informs the user what command will be initiated. If the user moves his or her finger prior to the full circle progress ring being formed, one command will be executed; otherwise another command will be executed. For example, if the present invention detects that the finger is being dragged within two seconds of the detection of the finger being placed on the screen, the present invention displays a gesture ring with standard and/or customized icons to select respective commands (illustrated in FIG. 2); whereas, after two seconds when the progress ring becomes a full circle, a user interface (UI) tool will appear (illustrated in FIGS. 3, 3B, and 3c). Rather than two second intervals, other embodiments may implement other time intervals. Heuristic techniques may be used to determine the time interval most appropriate for an implementation. Notably other commands may be triggered by the present invention depending on the needs of the software application.

The progress ring is a visual cue that informs the user how much time remains before a particular command is triggered. The fuller the progress ring's circle, the less time a user has to execute a first command and the less time the user needs to wait until a second different command is executed. Additionally, embodiments detect a tap on the touchscreen where the finger position does not change, in which case yet another command is executed; the visual feedback in this case is that the command is immediately executed.

Embodiments of the present invention report the progress using different means. In an embodiment, a series of lines or bars (rather than a circle) may be displayed as time progresses to indicate which command will be executed. The more lines or bars displayed indicate the amount of time that has elapsed. Another embodiment uses audio cues to indicate the amount of time that has elapsed, and therefore, which command will be executed depending on the next touch event (e.g., removal from the touchscreen or commencement of a dragging motion).

Figure 2:
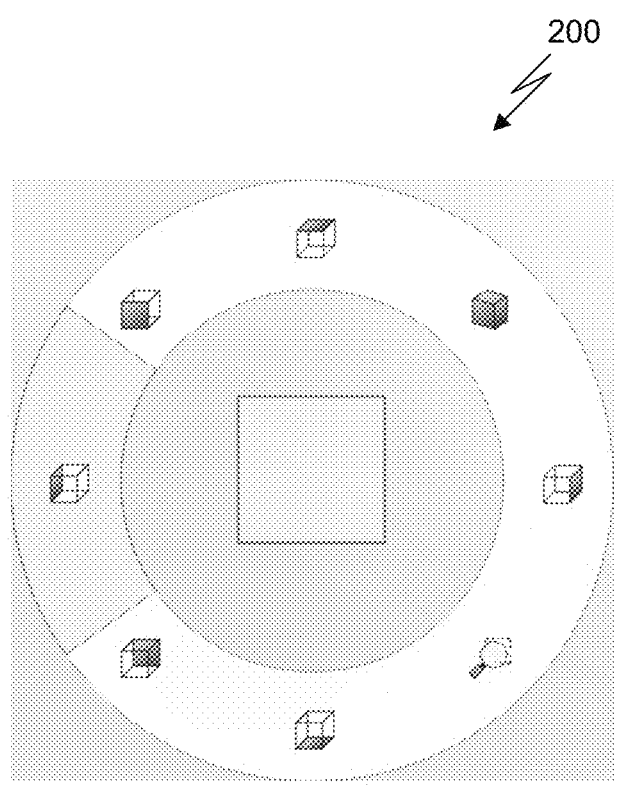
FIG. 2 is an illustration of a gesture ring in an embodiment of the present invention.

Referring now to FIG. 2, a gesture ring 200 with icons is shown. The gesture ring 200 is implemented in the SOLIDWORKS 2016 CAD application (a non-touch application), and enables a direction of a mouse gesture to select amongst several commands. In the SOLIDWORKS 2016 CAD application, the gesture ring 200 appears after a right mouse button event is detected. The present invention will allow for the gesture ring 200 to appear in a touch implementation based on the detection of a drag motion in less than a specific period of time (e.g., two seconds or less).

Figure 3A:
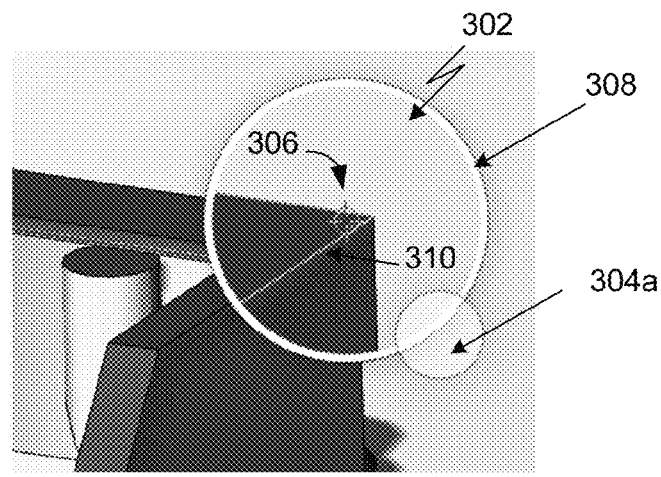
FIGS. 3a, 3b, and 3c are illustrations of a user interface tool in an embodiment of the present invention.

Referring now to FIG. 3a, a UI tool 302 is shown. The UI tool 302 resembles a bubble and can increase and decrease the size of an area enclosed by the UI tool. In an embodiment, if the finger holds steady for two seconds without producing a dragging motion, the progress ring will complete and thereby become a full circle after which the UI tool 302 will appear.

Additionally, the UI tool 302 may be initiated by other means than as one action of a multiple actions triggered by a single gesture. For example, a user may select a UI item from a menu or use voice activation to initiate the UI tool. Moreover, the UI tool may be initiated if the system detects that the user is having difficulty locating and/or selecting an object.

Importantly, the UI tool 302 is initially offset above and to the side of a finger touch area 304a, unlike magnifier tools in prior art applications where the finger touch area is in the center of a magnified area and therefore obscures the objects beneath the touch area, or where the center of the magnified area is offset from the finger touch area but displays objects beneath the touch area making it difficult for a user to associate the magnified area with the target of the magnification. So as not to lose the visual context of the area enclosed by the UI tool 302, the present invention locates the center 306 of the enclosed area relative to the geometry outside the enclosed area. The present invention is distinct from a magnifier tool in prior art in that the center 306 in FIGS. 3a and 312 in FIG. 3b of the UI tool perimeter ring 308 is the actual target of interest. The UI tool 302 may also change the magnification of the enclosed area allowing for a clear view of the enclosed area inside the perimeter 308 of the UI tool 302 in context with the rest of the geometry without any occlusion from the physical finger or hand. The touch area 304a in FIG. 3a is on the perimeter 308 of the UI tool 302 whereas the touch area 304b is not; however, both touch areas 304a/304b can maneuver the perimeter ring 308 as the finger is dragged on the touchscreen. Additionally, the touch area may or may not be visible. Embodiments may also position the perimeter ring 308 of the UI tool 302 close but not exactly coincident to a touch area, for example touch area 304b in FIG. 3b.

Figure 3B:
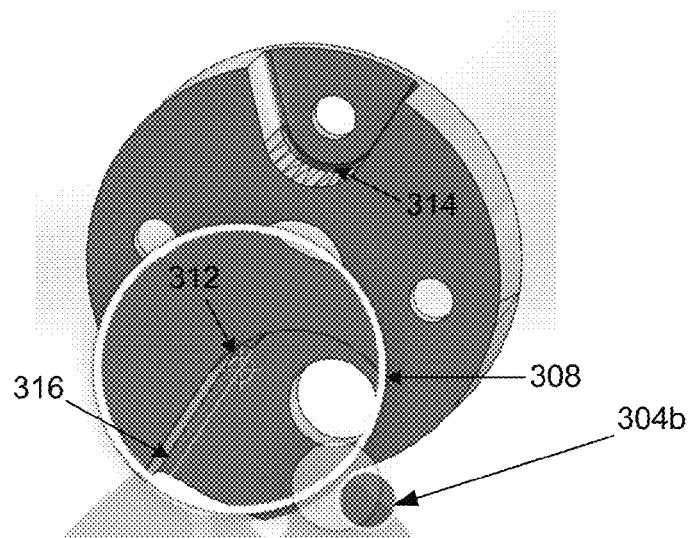
Figure 3C:
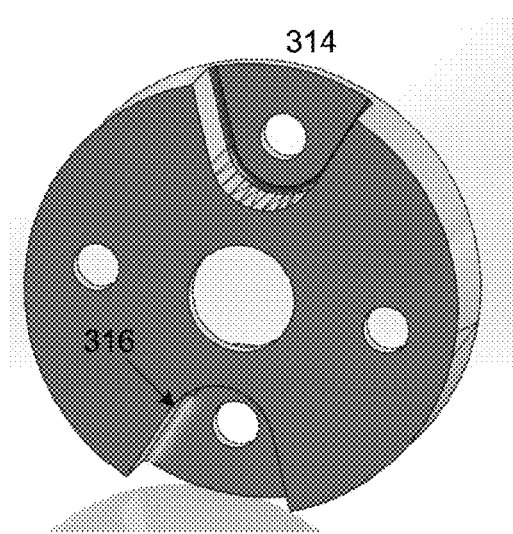

The enclosed area of perimeter 308 of the UI tool 302 not the touch area 304a/304b determines which entities may be operated on by a UI tool function such as a selection, hover highlighting, or magnification function. FIGS. 3a, 3b, and 3c illustrate these functions. FIGS. 3a and 3b show magnified content within the perimeter ring 308. FIGS. 3a and 3b also show cursors (e.g., centers 306/312) hovering over an edge 310 and an edge 316 respectively, which are highlighted and selectable. FIGS. 3b and 3c illustrate edge 314 and edge 316 that have been selected and highlighted.

Although the UI tool 302 shown in FIGS. 3a, 3b, and 3c has the enclosed area created by perimeter 308, it will be understood by those skilled in the art that modifications may be made to the circular enclosure shape. An aim of the enclosed area is to enable a user to focus on entities in the enclosed area. For highlighting and selection operations, however, a horseshoe shape, a pointer, or a crosshair may serve the same purpose.

The finger touch areas 304a/304b, each shown as a transparent circular area on the perimeter ring 308 of the UI tool 302, is driven by a user's finger to reposition the UI tool 302. The user manipulates the UI tool 302 to target a selection without the finger touch area 304 a/304b obscuring the area of selection. Additionally, to better control the direction of motion of the UI tool 302, the user may slide his or her finger along the perimeter 308 giving an illusion of a rolling motion of the UI tool 302 and/or a repositioning of the finger touch area 304a/304b to a different location on the perimeter of the UI tool 302. In embodiments of the present invention, the finger touch area 304 a/304b is initially displayed on near the lower left rim of the UI tool 302 for left-handed users and the lower right rim of the UI tool 302 for right-handed users. Determination of whether a user is a left-handed or right-handed user may be determined by a system option setting in a computer system.

As discussed the UI tool 302 may be used to highlight, select, and magnify one or more entities, for example, all the entities within perimeter ring 308. Additionally, the UI tool may be used to change the appearance inside the focus area (e.g., perimeter ring 308) to assist the user in viewing entities. Various display states may be localized in the focus area. For example, the entities inside a focus area may be presented in high contrast, in colorblind friendly palettes, and in ways to help the visually impaired; furthermore, color shading may be removed, a model may be shown as a wireframe model, a texture may be added and removed, and certain details of the model may be removed (e.g., entities that are smaller than a specified threshold value).

Furthermore, when the UI tool 302 is displayed two buttons are introduced in the touch user interface panel to dynamically change the zoom level inside the UI tool 302. These buttons—zoom in and zoom out—are displayed only when a UI magnifier tool is displayed on the computer touchscreen. When the UI magnifier tool is displayed on the touchscreen, a user may use the zoom in button to change the zoom scale from 1× to 2× or 2× to 3× or 3× to 4×, and so on, for example. The zoom out button changes the zoom level from 4× to 3×, or 3× to 2×, or 2× to 1×, and so on, for example.

Figure 4:
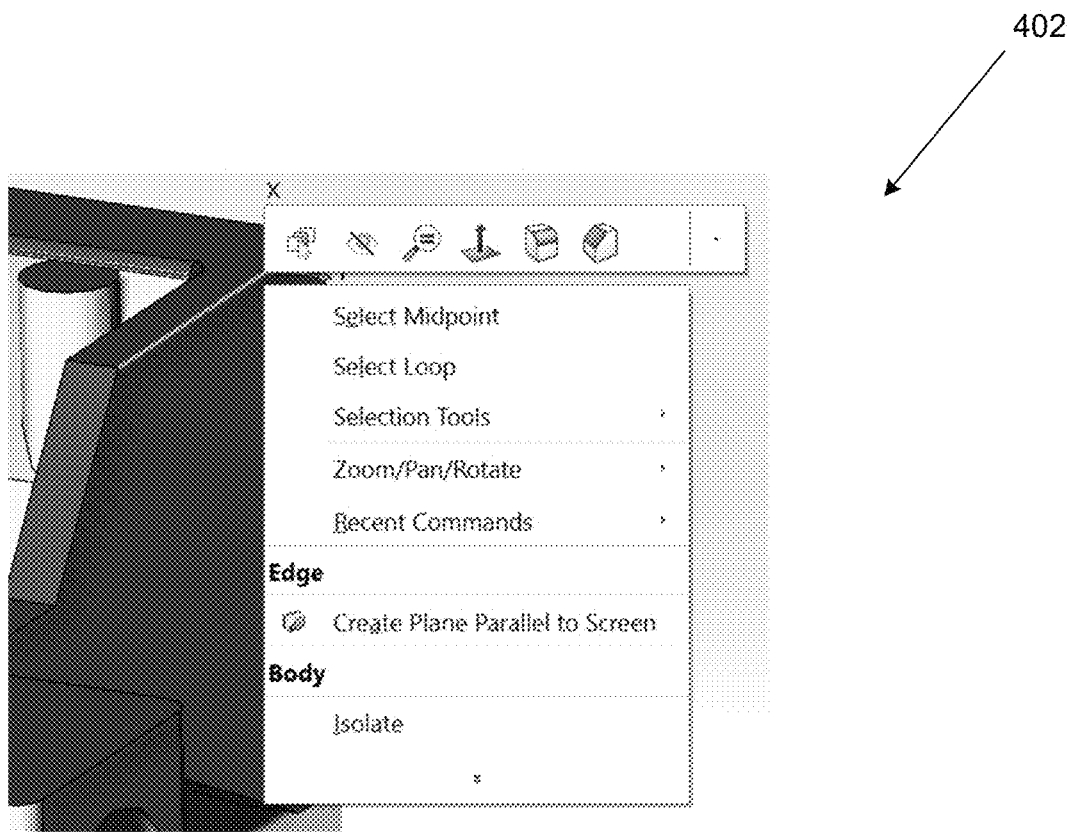
FIG. 4 is an illustration of a contextual menu in an embodiment of the present invention.

As discussed, after pressing a finger on the touchscreen and detecting a dragging motion one of two commands may be executed depending on the amount of time that has elapsed before a dragging motion was detected. Additionally, a third command may be executed after pressing a finger on the touchscreen. The third command is executed if the finger is removed from the touchscreen at any time without being dragged. This third command may display a contextual menu appropriate to the item under the finger touch area (e.g., contextual menu 402 illustrated in FIG. 4). For computer systems with mouse devices, this occurs in many cases by pressing and releasing the right mouse button.

Figure 5:
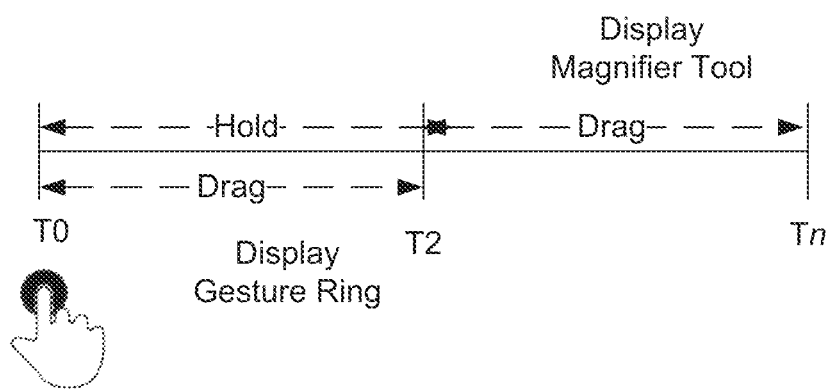
FIG. 5 is a schematic of the triggering of commands in an embodiment of the present invention.

Referring now to FIG. 5, the breakoff points that trigger a number of commands are illustrated. At T0, the present invention detects a finger down event. If the finger down event is not immediately followed by a finger up event (meaning the user has tapped the touchscreen), the visual progress ring is displayed to indicate the amount of time elapsing (as has been discussed). If the finger remains in the same location until the visual progress ring completes at T2 (e.g., for more than two seconds), and then a drag motion is detected, one command is activated, such as the previously discussed UI tool command. If the drag motion is detected prior to the completion of the visual progress ring (e.g., for two seconds or less), then another command is executed, such as a command that displays the gesture ring. If at any time the user lifts his or her finger off the computer screen without the location of the finger changing, then yet another command may be executed such as a command that displays and activates a contextual menu.

An advantage of the present invention includes mapping commonly used mouse events to gestures used for a touch device, which does not have a multi-button mouse or keyboard to activate commands; another advantage is including visual and/or audio feedback to indicate which of several commands will be executed.

Other advantages include improving the usefulness of a UI tool by initially offsetting the touch area that controls the motion of the UI tool so not to obscure objects beneath the touch area, the location of the offset depending on whether a user is left- or right handed.

Figure 6A:
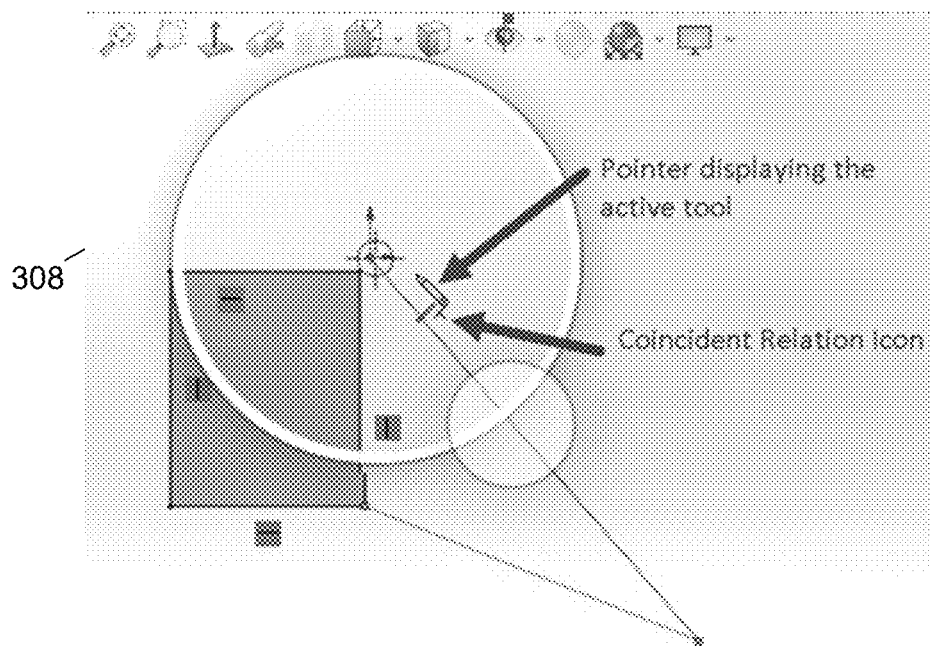
FIGS. 6a and 6b illustrate feedback tools in an embodiment of the present invention.
Figure 6B:
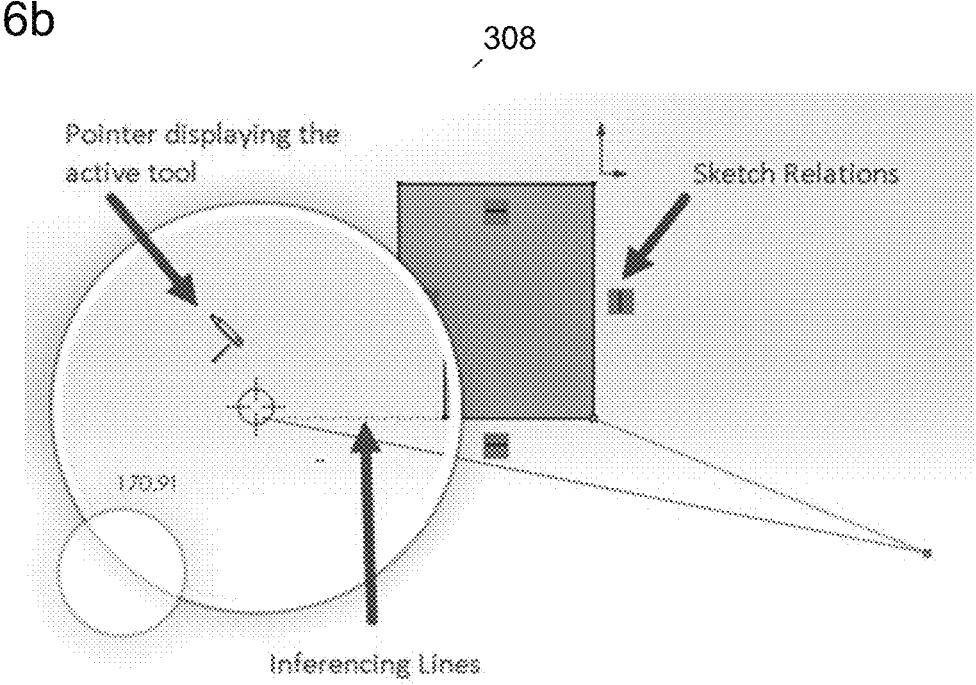

Referring to FIGS. 6a and 6b illustrate further examples of objects not obscured by using the present invention. FIGS. 6a and 6b show a zoomed in right-handed and zoomed out left-handed UI tools, respectively. Inside the perimeter ring 308 are objects that provide valuable feedback to a user. A pointer 602 provides feedback to the user with respect to the active tool. An icon 604 informs the user of a coincident relationship. Additionally, inferencing lines 606 provide feedback to the user. Without an implementation of the present invention feedback objects 602, 604, and 606 would be obscured by a user's finger and/or hand.

Yet other advantages of the present invention are that in addition to magnifying an object, the UI tool may be used for selecting an object, highlighting an object, and/or magnifying an object as shown in FIGS. 3a, 3b, and 3c.

Computer Support

Figure 7:
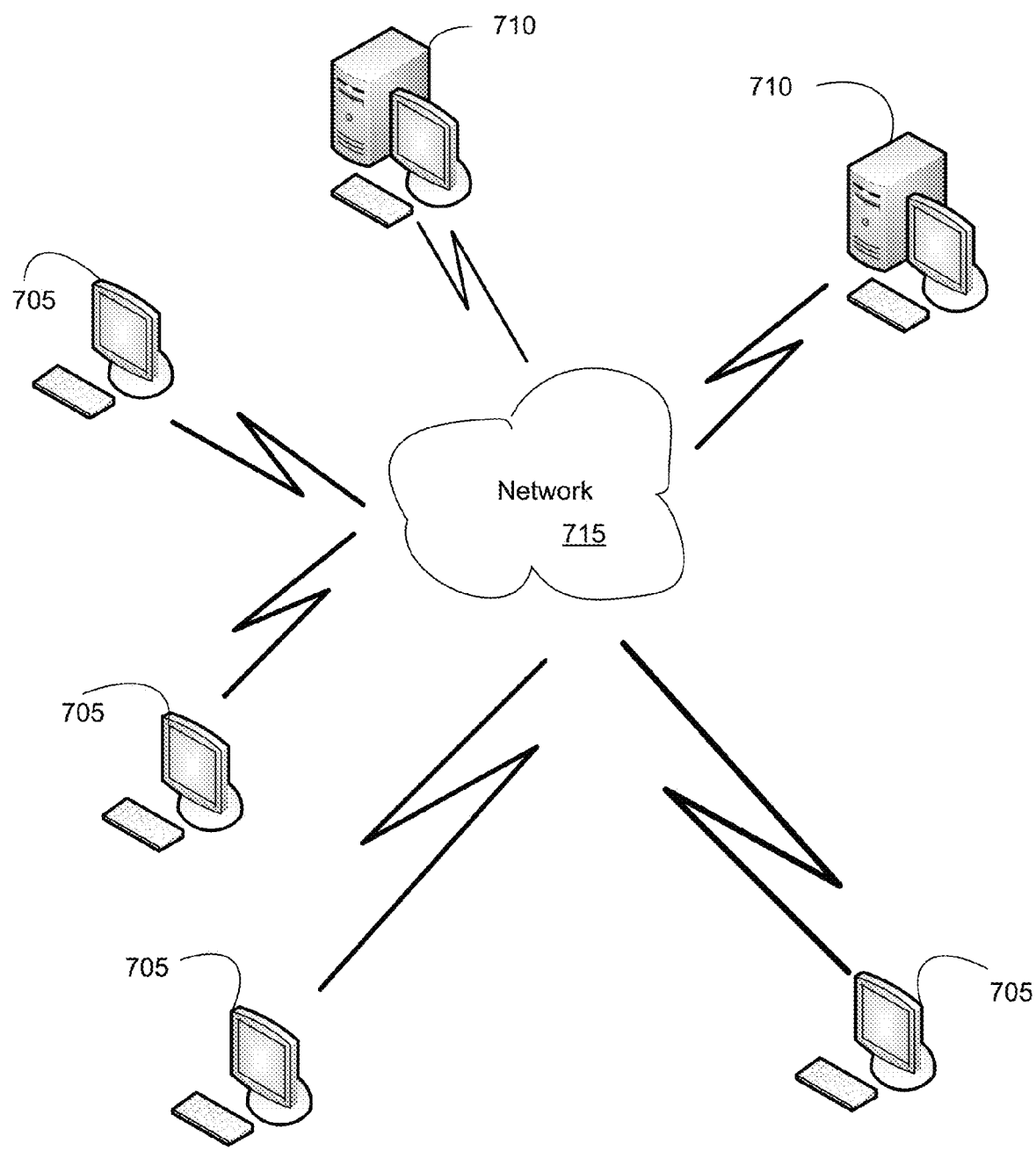
FIG. 7 is a schematic diagram of a computer system network embodying the present invention.

FIG. 7 illustrates a computer network or similar digital processing environment in which the present invention may be implemented.

Client computer(s)/device(s) 705 and server computer(s) 710 provide processing, storage, and input/output, and execute application programs and the like. Client computer(s)/device(s) 705 can also be linked through communications network 715 to other computing devices, including other client computer(s)/device(s) 705 and server computer(s) 710. Communications network 715 can be part of a remote access network, a global network (e.g., the Internet), a worldwide collection of computers, local area or wide area networks, gateways, and cloud computing that currently use respective protocols (TCP/IP, Bluetooth, etc.) to communicate with one another. Other electronic computer/device network architectures are suitable.

Figure 8:
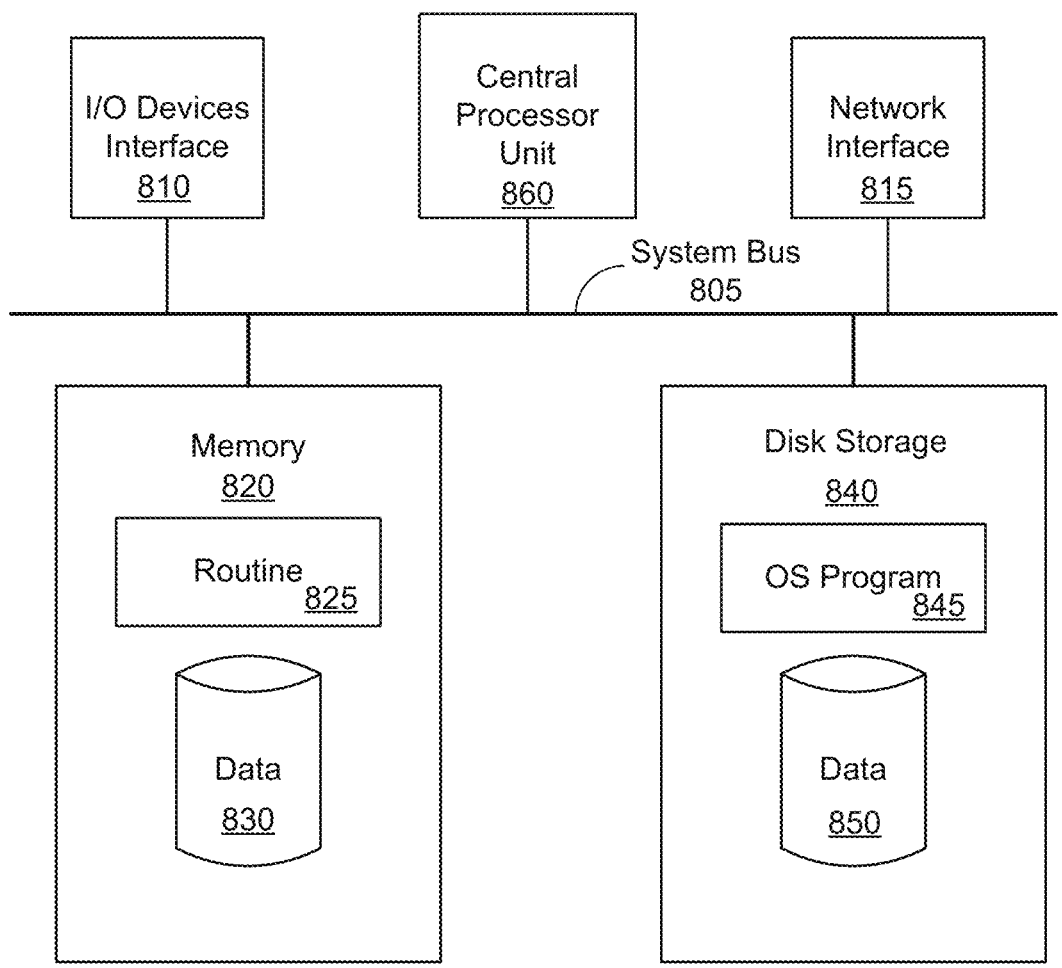
FIG. 8 is a block diagram of a computer system embodying the present invention.

FIG. 8 is a diagram of the internal structure of a computer (e.g., client computer/device 705 or a server computer 710) in the computer network of FIG. 7. Each computer 705, 710 contains system bus 805, where a bus is a set of hardware lines used for data transfer among the components of a computer or processing system. System bus 805 is essentially a shared conduit that connects different elements of a computer system (e.g., processor, disk storage, memory, input/output ports, network ports, etc.) and enables the transfer of information between the elements. Attached to system bus 805 is I/O device interface 810 for connecting various input and output devices (e.g., keyboard, mouse, stylus, touch input, displays, printers, speakers) to the computer 705, 710. Network interface 815 allows the computer to connect to various other computer(s)/device(s) attached to a network (e.g., network 715 of FIG. 7). Memory 820 provides volatile storage for computer software instructions 825 and data 830 used to implement an embodiment, such as the system of the present invention (e.g., progress ring 102/104/106, UI tool 302, and supporting software code and data structures described herein). Disk storage 840 provides non-volatile storage for computer software instructions 825 and data 830 used to implement an embodiment of the present invention. Central processor unit 860 is also attached to system bus 805 and provides for the execution of computer instructions.

In one embodiment, the software instructions 825 and data 830 are generated by a computer program product. The computer program product may include a computer readable medium such as a removable storage medium (e.g., one or more DVD-ROM's, CD-ROM's, diskettes, tapes), a memory medium, and the like. The computer program product provides at least a portion of the software instructions for the present invention. The computer program product can be installed by any suitable software installation procedure, as is well known in the art. In another embodiment, at least a portion of the software instructions may also be downloaded over a cable, communication, and/or wireless connection. In other embodiments, the software 725 and data 830 are a computer program propagated signal product embodied on a propagated signal on a propagation medium (e.g., a radio wave, an infrared wave, a laser wave, a sound wave, or an electrical wave propagated over a global network such as the Internet, or other network(s)). Such carrier medium or signals provide at least a portion of the software instructions for the present invention routines/program 825.

In alternate embodiments, the propagated signal is an analog carrier wave or digital signal carried on the propagated medium. For example, the propagated signal may be a digitized signal propagated over a global network (e.g., the Internet), a telecommunications network, or other network. In one embodiment, the propagated signal is a signal that is transmitted over the propagation medium over a period of time, such as the instructions for a software application sent in packets over a network over a period of milliseconds, seconds, minutes, or longer. In another embodiment, the computer readable medium of the computer program product is a propagation medium that the computer/device 705, 710 may receive and read, such as by receiving the propagation medium and identifying a propagated signal embodied in the propagation medium, as described above for computer program propagated signal product.

What is claimed is:
1. A computer-implemented method for triggering multiple user directed commands from a single gesture, the method comprising:
   detecting a presence of an object touching a touchscreen device, the presence of the object touching the touchscreen device being a first touch event that enables performing a first user directed command, a second user directed command, a third user directed command, and a fourth user directed command, wherein one of the first user directed command, the second user directed command, the third user directed command, and the fourth user directed command are performed based on a single gesture that includes the first touch event and a second touch event;
   determining if the first touch event is immediately followed by the second touch event;
   in response to determining the first touch event is immediately followed by the second touch event and the second touch event being a lift off, identifying the single gesture as a tap and performing the first user directed command; and
   in response to determining the first touch event is not immediately followed by the second touch event:
      (i) identifying the first touch event as a hold without movement;

(ii) displaying a changing graphical object around and outside a diameter surrounding the object touching the touchscreen device, the changing graphical object indicating elapsing time after the first touch event;
(iii) calculating elapsed time between the first touch event and commencing of the second touch event, the second touch event being a lift off event or a drag event subsequent to the hold of the first touch event; and
(iv) performing the second user directed command if the second touch event is the lift off event subsequent to the hold of the first touch event or, if the second touch event is the drag event, using the calculated elapsed time to determine which of the third user directed command or the fourth user directed command to perform, wherein:
if the calculated elapsed time between the first touch event and commencement of the second touch event is less than a threshold, executing the third user directed command; and
if the calculated elapsed time between the first touch event and commencement of the second touch event is greater than the threshold, executing the fourth user directed command,
such that the third user directed command and the fourth user directed command are executed as a function of calculated elapsed time in performing the single gesture.

2. The computer-implemented method of claim 1, wherein the object is a finger or a stylus.

3. The computer-implemented method of claim 1, further comprising:
audibly indicating the elapsing time after the first touch event.

4. The computer-implemented method of claim 1, wherein the changing graphical object further indicates a user directed command to be performed.

5. The computer-implemented method of claim 1, wherein:
the third user directed command or the fourth user directed command displays a user interface tool; and
the user interface tool is used to perform a highlight operation and a select operation.

6. A non-transitory computer-readable data storage medium comprising instructions causing a computer to:
detect an object touching a touchscreen display, the object touching the touchscreen display being a first touch event that enables performing a first user directed operation, a second user directed operation, a third user directed operation, and a fourth user directed operation, wherein one of the first user directed operation, the second user directed operation, the third user directed operation, and the fourth user directed operation are performed based on a single gesture that includes the first touch event and a second touch event;
determine if the first touch event is immediately followed by the second touch event;
in response to determining the first touch event is immediately followed by the second touch event and the second touch event is a lift off, identify the single gesture as a tap and perform the first user directed operation; and
in response to determining the first touch event is not immediately followed by the second touch event:
(i) identify the first touch event as a hold without movement;

(ii) display a changing graphical object around and outside a diameter surrounding the object touching the touchscreen device, the changing graphical object indicating elapsing time after the first touch event;
(iii) calculate elapsed time between the first touch event and commencement of the second touch event, the second touch event being a lift off event or a drag event subsequent to the hold of the first touch event; and
(iv) perform the second user directed operation if the second touch event is the lift off event subsequent to the hold of the first touch event or, if the second touch event is the drag event, use the calculated elapsed time to determine which of the third user directed operation and the fourth user directed operation to perform, wherein:
if the calculated elapsed time between the first touch event and commencement of the second touch event is below a threshold the third user directed operation is performed; and
if the calculated elapsed time between the first touch event and commencement of the second touch event is above the threshold the fourth user directed operation is performed, such that the third user directed operation and the fourth user directed operation are executed as a function of calculated elapsed time in performing the single gesture.

7. The computer-readable storage medium of claim 6, wherein the object is a finger or a stylus.

8. The computer-readable storage medium of claim 6, wherein:
the second touch event indicates that the object is being dragged on the touchscreen display.

9. The computer-readable storage medium of claim 6, further comprising instructions causing the computer to audibly indicate the elapsing time after the first touch event.

10. The computer-readable storage medium of claim 6, wherein the changing graphical object further indicates a user directed operation to be performed.

11. The computer-readable storage medium of claim 6, wherein:
one of the third user directed operation and the fourth user directed operation displays a user interface tool;
the user interface tool is used to perform a magnify operation; and
the user interface tool is initially offset from a position of the object touching the touchscreen display.

12. A computer system comprising:
a processor operatively coupled to a data storage system, the data storage system storing a three-dimensional model; and
a data storage memory operatively coupled to the processor and comprising instructions to configure the processor to:
detect an object touching a touchscreen display, the object touching the touchscreen display being a first touch event that enables performing a first user directed operation, a second user directed operation, a third user directed operation, and a fourth user directed operation, wherein one of the first user directed operation, the second user directed operation, the third user directed operation, and the fourth user directed operation are performed based on a single gesture that includes the first touch event and a second touch event;

determine if the first touch event is immediately followed by the second touch event;
in response to determining the first touch event is immediately followed by the second touch event and the second touch event being a lift off, identify the single gesture as a tap and perform the first user directed operation, and
in response to determining the first touch event is not immediately followed by the second touch event:
  (i) identify the first touch event as a hold without movement;
  (ii) display a changing graphical object around and outside a diameter surrounding the object touching the touchscreen device, the changing graphical object indicating elapsing time after the first touch event;
  (iii) calculate elapsed time between the first touch event and commencement of the second touch event, the second touch event being a lift off event or a drag event subsequent to the hold of the first touch event; and
  (iv) perform the second user directed operation if the second touch event is the lift off event subsequent to the hold of the first touch event or, if the second touch event is the drag event, use the calculated elapsed time to determine which of the third user directed operation and the fourth user directed operation to perform, wherein:
    if the calculated elapsed time between the first touch event and commencement of the second touch event is below a threshold the third user directed operation is performed; and
    if the calculated elapsed time between the first touch event and commencement of the second touch event is above the threshold the fourth user directed operation is performed, such that the third user directed operation and the fourth user directed operation are executed as a function of calculated elapsed time in performing the single gesture.

13. The computer system of claim 12, wherein the object is a finger or a stylus.

14. The computer system of claim 12, wherein:
the second touch event indicates that the object is being dragged on the touchscreen display.

15. The computer system of claim 12, further comprising instructions causing the processor to audibly indicate the elapsing time after the first touch event.

16. The computer system of claim 12, wherein the changing graphical object further indicates a user directed operation to be performed.

17. The computer system of claim 12, wherein:
one of the third user directed operation and the fourth user directed operation displays a user interface tool; and
the user interface tool is initially offset from a position of the object touching the touchscreen display.

18. The method of claim 4, wherein the changing graphical object indicates the user directed command to be performed using a graphic symbol representing the user directed command to be performed.

19. The method of claim 1, wherein the second user directed command is a command to display and activate a contextual menu corresponding to a computer-aided design (CAD) model element under the object touching the touchscreen device.

* * * * *